United States Patent [19]

Masuoka

[11] Patent Number: 4,525,811
[45] Date of Patent: Jun. 25, 1985

[54] SEMICONDUCTOR MEMORY AND METHOD OF PRODUCING THE SAME

[75] Inventor: Fujio Masuoka, Yokohama, Japan

[73] Assignee: Tokyo Shibaura Denki Kabushiki Kaisha, Kawasaki, Japan

[21] Appl. No.: 344,047

[22] Filed: Jan. 29, 1982

[30] Foreign Application Priority Data

Feb. 6, 1981 [JP] Japan .................................. 56/16651

[51] Int. Cl.³ ............................................ G11C 11/40
[52] U.S. Cl. ...................................... 365/154; 365/189
[58] Field of Search ................ 365/154, 149, 189, 182

[56] References Cited

PUBLICATIONS

IEEE Journal of Solid-State Circuits vol. SC-14, No. 2, pp. 482-485, Apr. 1979.

Primary Examiner—Terrell W. Fears
Attorney, Agent, or Firm—Finnegan, Henderson, Farabow, Garrett & Dunner

[57] ABSTRACT

A static RAM using a flip-flop circuit as a memory cell is disclosed. The gate oxide film of the MOS transistor for selecting the memory cell is thicker than the gate oxide film of the MOS transistor included in the peripheral circuit of the memory matrix.

5 Claims, 6 Drawing Figures

F I G. 1
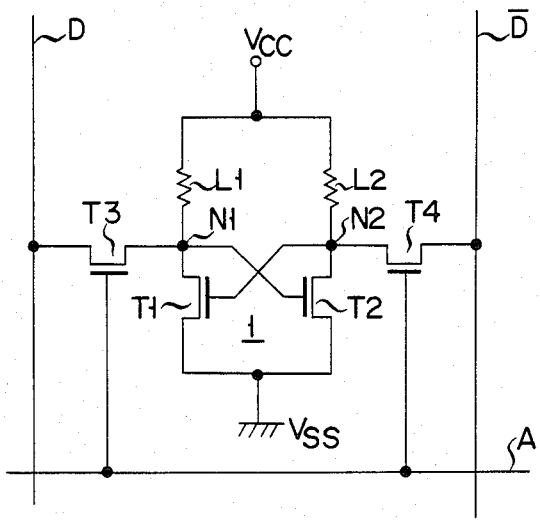
F I G. 2
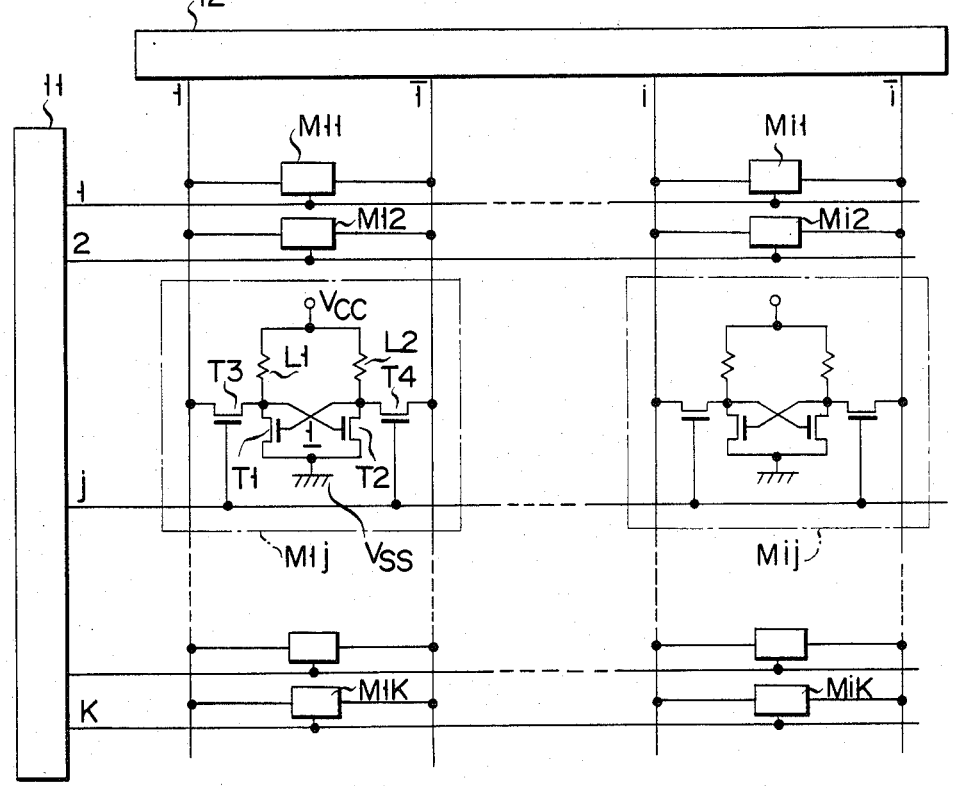

SEMICONDUCTOR MEMORY AND METHOD OF PRODUCING THE SAME

BACKGROUND OF THE INVENTION

This invention relates to a semiconductor memory such as a static random access memory (RAM) comprising a flip-flop circuit as a memory cell and to a method of producing the semiconductor memory.

Recently, it is a matter of serious concern in this field to improve the access time of a semiconductor memory. A static RAM comprising MOS transistors of polycrystalline silicon (polysilicon) gate type, is disclosed in, for example, U.S. Pat. No. 4,110,776 issued to G. R. Mohan Rao et al. It is desirable to improve the access time of the static RAM of polysilicon gate type. For improving the access time of the static RAM, the gate oxide film of each of the MOS transistors included in the RAM is formed thin in general so as to increase the conductance gm thereof. Thus, it is desirable to make the gate oxide film thin with respect to the MOS transistors included in the peripheral circuits of the memory matrix, such as the input buffer circuit, decoder circuit, sense amplifier, or output buffer circuit. Since the MOS transistor for selecting the memory cell is also formed together with the MOS transistor included in the peripheral circuit, the gate oxide film of the MOS transistor for selecting the memory cell is also made thin.

In order to obtain an access time of, for example, 50 n sec or less, it is particularly important to solve the problem of delay time encountered by the row decoder, which serves to select the row of memory cells, when the address line is changed from a low level to a high level. However, the conventional address line is formed of polysilicon. In addition, the gate oxide film is formed thin in each of the MOS transistors for selecting the memory cells as described above, leading to a relatively large capacitance. It follows that a large RC time constant causes delay in the rise of the signal generated from the row decoder when selecting the address line.

SUMMARY OF THE INVENTION

An object of this invention is to provide an improved semiconductor memory, e.g., a static RAM operating at a high speed.

Another object is to provide a method of producing an improved semiconductor memory, e.g., a static RAM operating at a high speed.

According to this invention, there is provided an integrated static RAM comprising a flip-flop circuit constituting a memory cell, a MOS transistor for selecting the memory cell, and a peripheral circuit formed in a substrate in which is formed a memory matrix, wherein the gate oxide film of the MOS transistor for selecting the memory cell is thicker than the gate oxide film of the MOS transistor included in the peripheral circuit.

Also provided is a method of producing an integrated static RAM comprising a flip-flop circuit constituting a memory cell, a MOS transistor for selecting the memory cell, and a peripheral circuit formed in a substrate in which is formed a memory matrix, said method comprising the steps of forming a thick oxide film on a semiconductor substrate; removing the oxide film in a manner to selectively expose the substrate surface; forming a first oxide film on the exposed substrate surface; removing the first oxide film in a manner to selectively expose the substrate surface; forming a second oxide film, which provides a second gate oxide film, on the exposed substrate surface, the remaining first oxide film being thickened in this step so as to provide a first gate oxide film; forming a polysilicon layer in a manner to cover both the first and second gate oxide films; and forming source and drain regions in the substrate so as to form two MOS transistors differing from each other in the thickness of the gate oxide film.

Further provided is a method of producing an integrated static RAM comprising a flip-flop circuit constituting a memory cell, a MOS transistor for selecting the memory cell, and a peripheral circuit formed in a substrate in which is formed a memory matrix, said method comprising the steps of forming a thick oxide film on a semiconductor substrate; removing the oxide film in a manner to selectively expose the substrate surface; forming a first oxide film on the exposed substrate surface; forming a first polysilicon layer in a manner to selectively cover the first oxide film and provide a wiring layer, the covered region of the oxide film providing a first gate oxide film; removing the first oxide film in the region which is not covered with the first polysilicon layer in a manner to expose selectively the substrate surface; forming a second gate oxide film thinner than the first gate oxide film on the exposed substrate surface; forming a second polysilicon layer in a manner to cover the second gate oxide film and provide a wiring layer; and forming source and drain regions in the substrate so as to form two MOS transistors differing from each other in the thickness of the gate oxide film.

BRIEF DESCRIPTION OF THE DRAWING

FIG. 1 is a circuit diagram showing the memory cell of a static RAM according to one embodiment of this invention;

FIG. 2 is a circuit diagram of the static RAM using the memory cell shown in FIG. 1;

DETAILED DESCRIPTION OF THE PREFERRED EMBODIMENT

Figure 3:
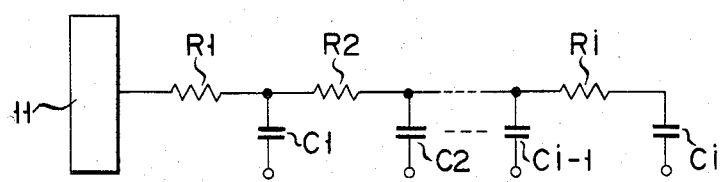
FIG. 3 is an equivalent circuit diagram of the region relating to one address line of the static RAM shown in FIG. 2.

FIG. 1 shows the basic construction of the memory cell of a static RAM according to one embodiment of this invention. As seen from the drawing, the memory cell comprises a first inverter consisting of a load element (i.e. resistor) L1 and a driving transistor T1, and a second inverter consisting of a load element L2 and a driving transistor T2. These first and second inverters are cross-coupled so as to form a flip-flop circuit 1. When a node N1 of the first inverter bears a potential of high level, the potential level is low in a node N2 of the second inverter, and vice versa. Which of these nodes bears a potential of high level determines the data stored in the memory cell. A transistor T3 or T4 for selecting the memory cell is driven by an address select line A so as to transfer the data of the node N1 or N2 to a data line D or $\overline{D}$. Symbols "Vcc" and "Vss" shown is the drawing denote power sources.

A plurality of memory cells each constructed as shown in FIG. 1 are arranged to form a memory matrix as shown in FIG. 2. It should be noted that a memory cell of one bit is selected by a row decoder 11 and a column decoder 12. In the drawing of FIG. 2, memory cells M1j and Mij alone are shown in detail, with the other memory cells shown by blocks. The row decoder 11 serves to select a single address line from among address lines 1 to k. Likewise, the column decoder 12 serves to select a single data line D or $\overline{D}$ (D=1, 2, ..., i). The address line, which bears a low level during non-selection, bears a high level when selected by the column decoder 12, and vice versa.

FIG. 3 shows an electric equivalent circuit with respect to a single address line included in FIG. 2. Naturally, the address line is connected to the row decoder 11. Symbols R1 to Ri shown in FIG. 3 represent distributed constant resistors, with C1 to Ci denoting capacitances accompanying the transistors for selecting the memory cells. If the address line is formed of polysilicon, the sheet resistivity $\rho s$ of the address line is 20 $\Omega/\square$ to 60 $\Omega/\square$. If the sheet resistivity is 60 $\Omega/\square$ and 128 memory cells (8 bits) are driven, the resistance R is:

$$R = \sum_{i=1}^{128} Ri \approx 5 \times 10^4 \, \Omega.$$

If the gate oxide film thickness $t_{ox}$ of the transistor for selecting the memory cell is about 400 Å, the capacitance C is:

$$C = \sum_{i=1}^{128} Ci \approx 1.5 \times 10^{-12} \, F$$

and, the delay time Td is:

$$Td \approx 0.7RC = 52.5 \, n \, sec.$$

To be brief, the delay in the operation of the address line is 52.5 n sec if the gate oxide film thickness $t_{ox}$ is 400 Å. During the access time, the delay caused by the input buffer circuit, output buffer circuit, etc. is added to the value mentioned above, resulting in a further delay.

In order to overcome the above-noted difficulty, the gate oxide film of the MOS transistor for selecting the memory cell is made thicker in this invention than the gate oxide film of the MOS transistor included in the peripheral circuit. Specifically, the gate oxide film is 400 Å thick with respect to the MOS transistors included in the peripheral circuit (e.g., decoders 11, 12, input and output buffer circuits, sense amplifier, etc.) of the memory matrix shown in FIG. 2. On the other hand, the gate oxide film thickness is 800 Å with respect to the MOS transistors T3, T4 etc. for selecting the memory cells.

The polysilicon gates of the MOS transistors each having a gate oxide film thickness of 400 Å or 800 Å may be formed in a single step or in different steps.

Figure 4:
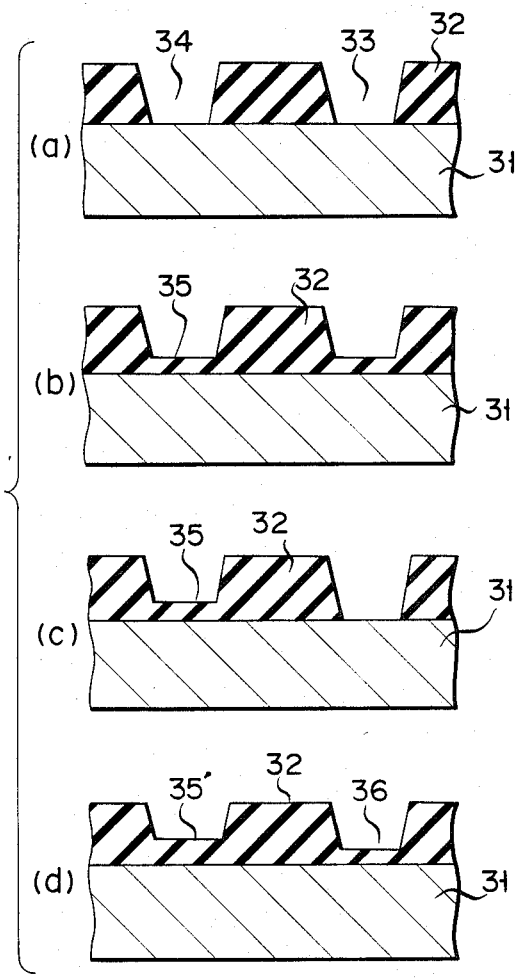
FIGS. 4 and 5 are cross-sectional views each showing the steps of producing a semiconductor memory according to one embodiment of this invention.

FIG. 4 shows in detail how to form in a single step the polysilicon gates of the MOS transistors each having a gate oxide film thickness of 400 Å or 800 Å. In the first steps, a silicon dioxide film 32 having a thickness of, for example, 8,000 Å, which is formed on a silicon substrate 31, is selectively removed so as to expose the silicon substrate 31 in regions 33 and 34 as shown in FIG. 4(a). Then, an oxide film 35 having a thickness of 500 Å is formed by thermal oxidation in the regions 33 and 34 (see FIG. 4(b)). The oxide film formed in the region 33 is etched away to expose the substrate 31 by the photolithographic method using a resist mask as shown in FIG. 4(c). After exposure of the substrate 31, an oxide film 36 having a thickness of 400 Å is formed by thermal oxidation in the region 33 as shown in FIG. 4(d). In this step, the oxide film 35 remaining in the region 34 is thickened to form an oxide film 35' having a thickness of about 800 Å. After formation of the oxide films 36 and 35', a polysilicon layer (not shown) is formed on the entire surface, followed by selectively removing the polysilicon layer by the photolithographic method so as to form polysilicon gates. Finally, source and drain regions are formed in the substrate 31 so as to form two MOS transistors differing from each other in the thickness of the gate oxide film. Naturally, the MOS transistor formed in the region 34 serves to select the memory cell.

Figure 5:
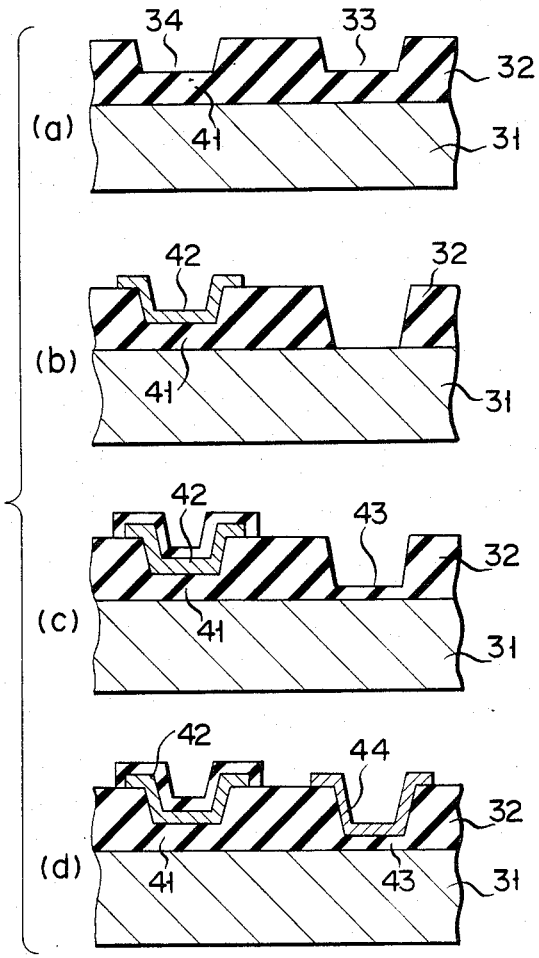

FIG. 5 covers the case where the polysilicon gates of MOS transistors differing from each other in the thickness of the gate oxide film are formed in different steps. In this case, a gate oxide film 41 having a thickness of 800 Å is formed in the region 34 as shown in FIG. 5(a), followed by forming a first polysilicon layer so as to prepare a polysilicon gate 42 and the wiring layer connected thereto as shown in FIG. 5(b). Then, the oxide film formed in the region 33 during the step of forming the oxide film 41 is removed to expose the substrate 31. After exposure of the substrate 31, an oxide film 43 having a thickness of 400 Å is formed by thermal oxidation in the region 33 (see FIG. 5(c)), followed by forming a second polysilicon layer so as to prepare a polysilicon gate 44 and the wiring layer connected thereto as shown in FIG. 5(d).

It should be noted that the gate oxide film is 800 Å thick, in contrast to the value of 400 Å described previously, in the resultant MOS transistor for selecting the memory cell. Thus, where the sheet resistivity $\rho s$ of the polysilicon gate is 60 $\Omega/\square$, the capacitance C is decreased to:

$$C = \sum_{i=1}^{128} Ci \approx 8 \times 10^{-13} \, F$$

On the other hand, the resistance R is:

$$R \approx 5 \times 10^4 \, \Omega$$

Thus, the delay time Td is:

$$Td \approx 0.7RC = 28 \, n \, sec$$

To be brief, the particular construction of the present invention permits decreasing the delay of address line to about half the value for the prior art, rendering it possible to provide a static RAM operable at high speed.

Figure 6:
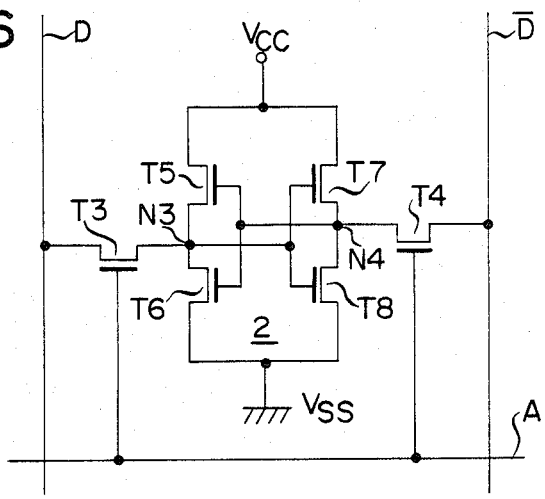
FIG. 6 is a circuit diagram showing the memory cell of a static RAM according to another embodiment of this invention.

In the embodiment described above, the present invention is applied to an N-channel type MOS circuit. But, it is also possible to apply the present invention to a complementary memory as shown in FIG. 6. In the circuit of FIG. 6, a memory cell is formed of a first C-MOS inverter consisting of a p-channel type MOS transistor T5 and an N-channel type MOS transistor T6, and a second C-MOS inverter consisting of a p-channel type MOS transistor T7 and an N-channel type MOS transistor T8. As seen from the drawing, the first and second C-MOS inverters are arranged in symmetry. Also, the gates of the transistors T5 and T6 are commonly connected to a node N4 of the transistors T7 and T8, with the gates of the transistors T7 and T8 being commonly connected to a node N3 of the transistors T5 and T6, so as to form a flip-flop circuit 2.

What is claimed is:

1. An integrated static RAM, comprising a flip-flop circuit constituting a memory cell, a MOS transistor for selecting the memory cell, and a peripheral circuit formed in a substrate in which is formed a memory matrix, wherein the gate oxide film of the MOS transistor for selecting the memory cell is thicker than the gate oxide film of the MOS transistor included in the peripheral circuit.

2. The integrated static RAM according to claim 1, wherein the flip-flop circuit is formed of cross-coupled first and second inverters each consisting of a load resistor and a driving transistor connected in series to the load resistor.

3. The integrated static RAM according to claim 1, wherein the flip-flop circuit is formed of cross-coupled first and second C-MOS inverters.

4. The integrated static RAM according to claim 1, wherein polysilicon gates formed in a single step are included in the MOS transistor for selecting the memory cell and the MOS transistor included in the peripheral circuit, respectively.

5. The integrated static RAM according to claim 1, wherein the MOS transistor for selecting the memory cell comprises a first polysilicon gate, and the MOS transistor included in the peripheral circuit comprises a second polysilicon gate formed separately from the first polysilicon gate.

* * * * *